United States Patent
Lee et al.

(10) Patent No.: US 9,627,599 B2
(45) Date of Patent: Apr. 18, 2017

(54) LED LIGHTING APPARATUS AND HEAT DISSIPATION MODULE

(71) Applicant: LG ELECTRONICS INC., Seoul (KR)

(72) Inventors: Donghyun Lee, Seoul (KR); Jaepyo Hong, Seoul (KR); Seokjae Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/298,118

(22) Filed: Jun. 6, 2014

(65) Prior Publication Data

US 2015/0008473 A1 Jan. 8, 2015

(30) Foreign Application Priority Data

Jul. 8, 2013 (KR) ........................ 10-2013-0079647
Jul. 8, 2013 (KR) ........................ 10-2013-0079648

(51) Int. Cl.
*H01L 33/64* (2010.01)
*F21V 29/00* (2015.01)
(Continued)

(52) U.S. Cl.
CPC .......... *H01L 33/642* (2013.01); *F21V 17/002* (2013.01); *F21V 29/006* (2013.01);
(Continued)

(58) Field of Classification Search
CPC ... H01L 2924/12041; H01L 2924/1531; H01L 33/642; H01L 33/64; H01L 33/648;
(Continued)

(56) References Cited

U.S. PATENT DOCUMENTS 3,518,420 A 6/1970 Kripp
8,177,397 B1 5/2012 Knoble et al.
(Continued)

FOREIGN PATENT DOCUMENTS

WO WO 2011055659 A1 * 5/2011
WO WO 2013/049982 A1 4/2013

OTHER PUBLICATIONS

European Search Report issued in Application No. 14174110.8 dated Oct. 30, 2014.
(Continued)

*Primary Examiner* — Natalia Gondarenko
(74) *Attorney, Agent, or Firm* — KED & Associates, LLP

(57) ABSTRACT

Provided is an LED light which may include a base plate, an LED module disposed under the base plate, a plurality of heat pipes provided over the base plate, and a plurality of heat dissipation fins provided over the base plate. The plurality of heat pipes may include a first portion thermally coupled to the base plate and a second portion that extends from the first portion. The plurality of heat dissipation fins may be spaced apart from each other and thermally coupled to the second portion of the heat pipes to dissipate heat from the LED module. The LED light may include an upper bracket provided over the plurality of heat dissipation fins and fastened to a hanger, and a plurality of studs that connect the base plate to the upper bracket.

18 Claims, 9 Drawing Sheets

(51) Int. Cl.
*F21V 17/00* (2006.01)
*F21V 29/71* (2015.01)
F21S 8/04 (2006.01)
F21V 17/10 (2006.01)
F21V 29/78 (2015.01)
F21Y 101/00 (2016.01)

(52) U.S. Cl.
CPC ............. *F21V 29/713* (2015.01); *F21S 8/043* (2013.01); *F21V 17/101* (2013.01); *F21V 29/78* (2015.01); *F21Y 2101/00* (2013.01)

(58) Field of Classification Search
CPC ... H01L 31/0203; H01L 33/507; H01L 33/54; H01L 33/48; H01L 2933/0033; H01L 25/07; H01L 25/18; H01L 23/057; H01L 23/13; H01L 23/34; H01L 23/36; H01L 23/3107; H01L 23/492; H01L 23/4952; H01L 23/49541; H01L 23/49575; F21V 29/713; F21V 29/006; F21V 17/002
USPC ..................................................... 257/99, 98
See application file for complete search history.

(56) References Cited

U.S. PATENT DOCUMENTS

| | | | |
|---|---|---|---|
| 8,405,947 B1* | 3/2013 | Green et al. ................. | 361/103 |
| 8,449,154 B2* | 5/2013 | Uemoto et al. .............. | 362/430 |
| 2006/0056169 A1 | 3/2006 | Lodhie et al. | |
| 2006/0267036 A1* | 11/2006 | Lee et al. ........................ | 257/98 |
| 2007/0230194 A1 | 10/2007 | Julia Vilarrasa | |
| 2007/0285926 A1 | 12/2007 | Maxik | |
| 2008/0043479 A1 | 2/2008 | Wang ............................ | 362/373 |
| 2009/0151900 A1 | 6/2009 | Huang ......................... | 165/80.3 |
| 2009/0230834 A1* | 9/2009 | Liu ................................. | 313/12 |
| 2009/0296411 A1 | 12/2009 | Chang et al. ................. | 362/373 |
| 2011/0000648 A1* | 1/2011 | Chien ....................... | 165/104.26 |
| 2011/0063831 A1 | 3/2011 | Cook | |
| 2011/0090669 A1 | 4/2011 | Sun et al. ....................... | 362/84 |
| 2011/0210657 A1 | 9/2011 | Paik | |
| 2012/0049716 A1 | 3/2012 | Chen et al. | |
| 2012/0098401 A1 | 4/2012 | Yu et al. | |
| 2012/0162983 A1 | 6/2012 | Pickholz | |
| 2012/0206927 A1* | 8/2012 | Miyahara ..................... | 362/382 |
| 2012/0286641 A1 | 11/2012 | Tsai | |
| 2013/0077293 A1 | 3/2013 | Lee et al. ..................... | 362/184 |
| 2013/0294070 A1* | 11/2013 | Tsao ........................ | F21V 29/006 362/235 |
| 2014/0177226 A1 | 6/2014 | Goelz et al. | |

OTHER PUBLICATIONS

European Search Report issued in Application No. 14167724.5 dated May 8, 2015.
U.S. Office Action issued in U.S. Appl. No. 14/280,111 dated Aug. 25, 2015.
U.S. Final Office Action dated Mar. 17, 2016 issued in U.S. Appl. No. 14/280,111.

* cited by examiner

LED LIGHTING APPARATUS AND HEAT DISSIPATION MODULE

CROSS-REFERENCE TO RELATED APPLICATION(S)

This application claims priority under 35 U.S.C. §119 to Korean Application Nos. 10-2013-0079647 filed on Jul. 8, 2013 and 10-2013-0079648 filed on Jul. 8, 2013, whose entire disclosures are hereby incorporated by reference.

BACKGROUND

1. Field

The present disclosure relates to an LED light, particularly an LED light with a plurality of heat dissipation fins.

2. Background

LED lights that include heat dissipation modules are known. However, they suffer from various disadvantages.

BRIEF DESCRIPTION OF THE DRAWING

The embodiments will be described in detail with reference to the following drawings in which like reference numerals refer to like elements wherein.

DETAILED DESCRIPTION

Hereinafter, embodiments of an LED light according to the present disclosure are described with reference to the accompanying drawings. In general, LED lights are lights using LEDs (Light Emitting Diode) as the sources of light. LED lights are being used increasingly more because of the long lifespan and high energy efficiency.

The LED lights may generate intense heat in use, and may require a heat dissipation module for dissipating the intense heat. The heat dissipation module may include heat dissipation fins. A plurality of heat dissipation fins may be disposed in one LED light. Moreover, the heat dissipation capacity of a heat dissipation module may depend on the number of LEDs and the brightness of the LEDs. Hence, there is a need for heat dissipation modules having optimal heat dissipation capacity.

Figure 1:
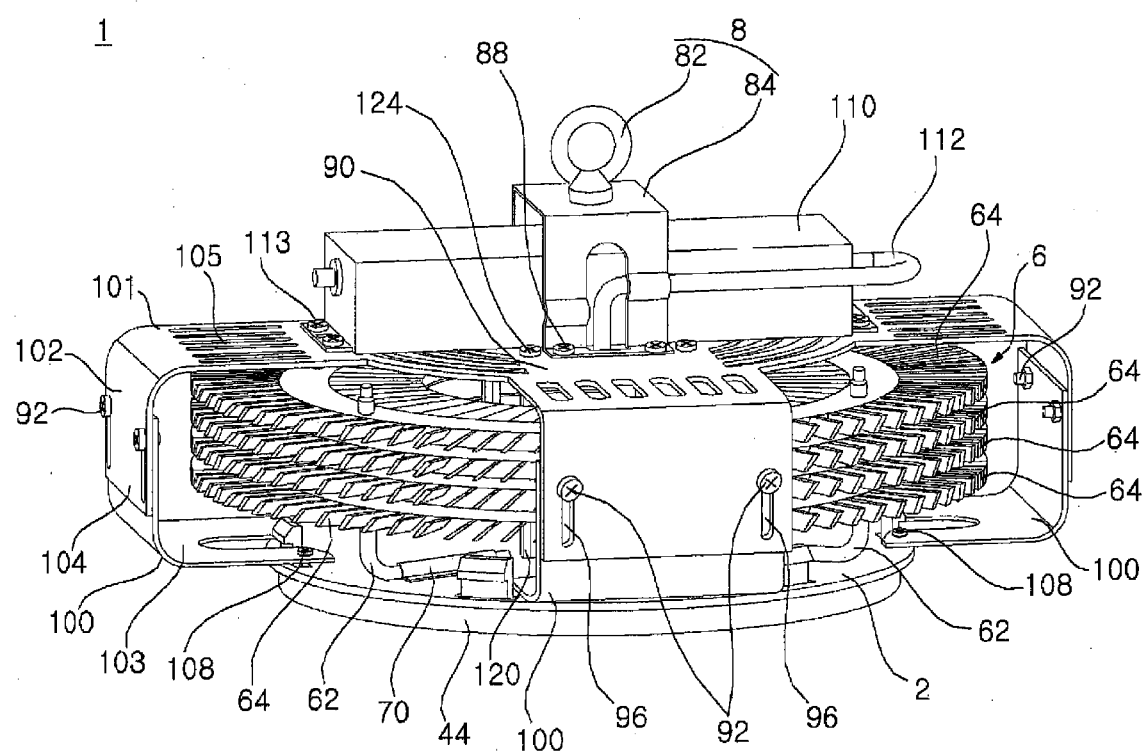
FIG. 1 is a perspective view showing an embodiment of an LED light according to the present disclosure.
Figure 2:
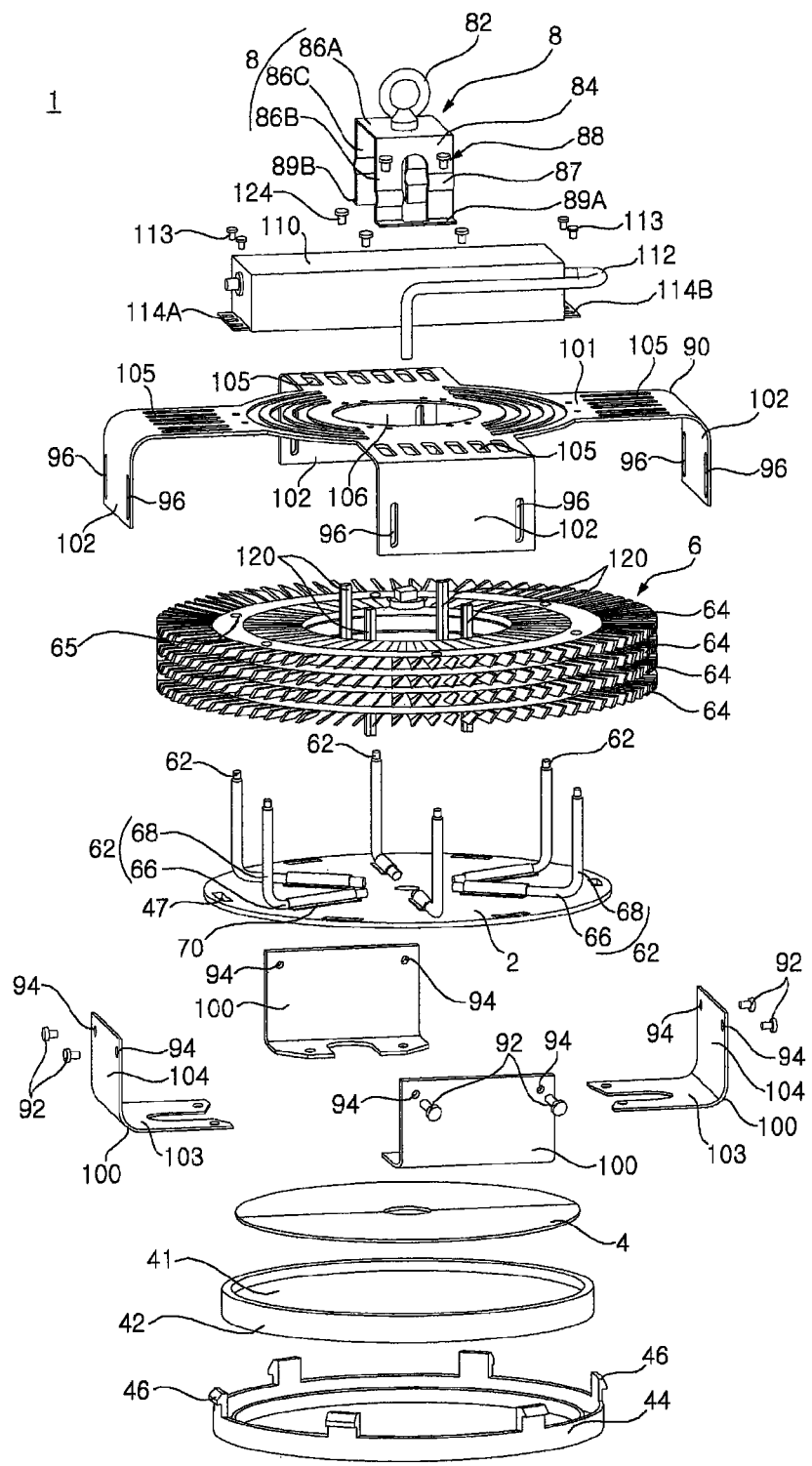
FIG. 2 is an exploded perspective view showing the embodiment of an LED light according to the present disclosure.
Figure 3:
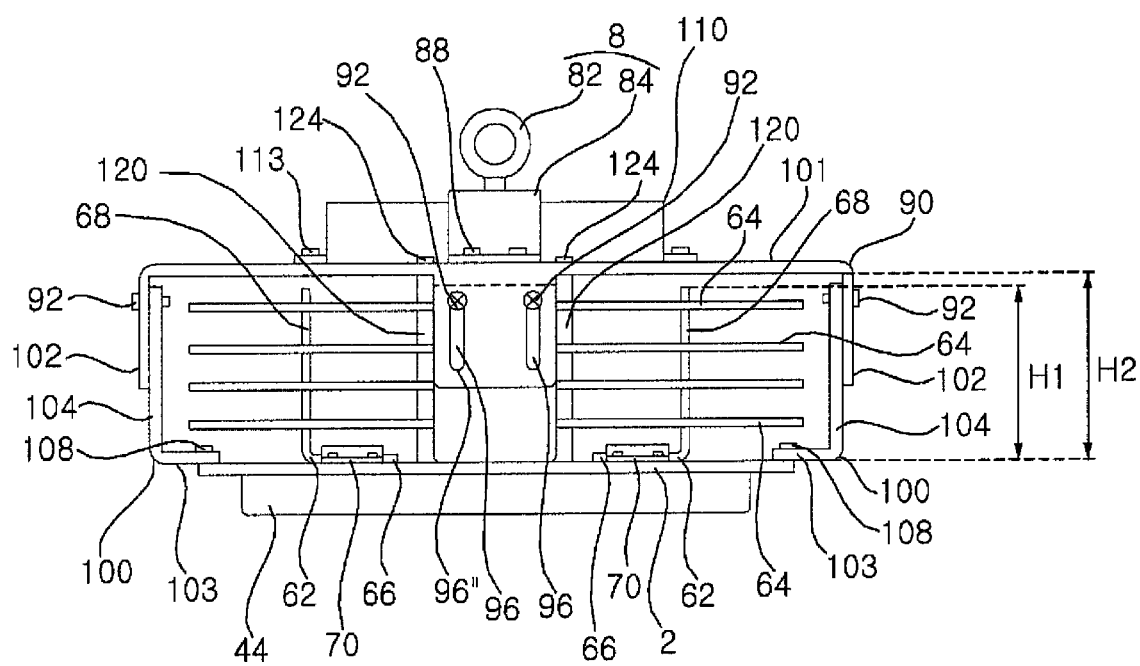
FIG. 3 is a side view of the embodiment of an LED light according to the present disclosure with a small number of heat dissipation fins.
Figure 4:
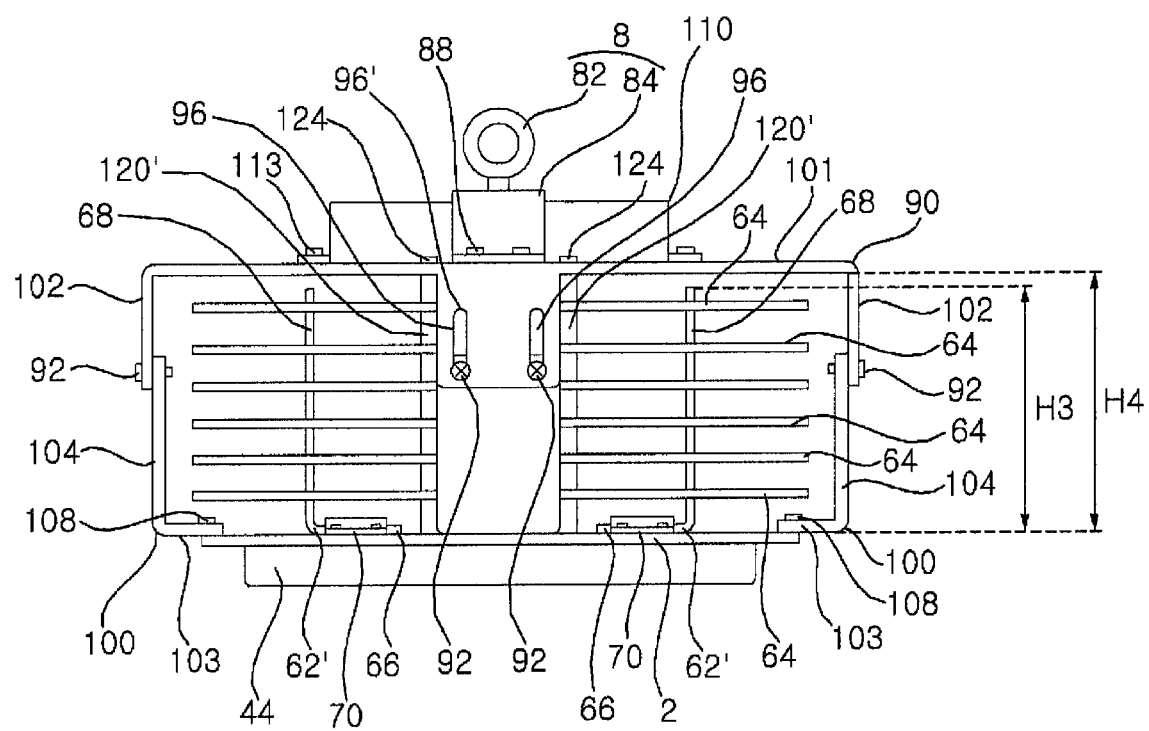
FIG. 4 is a side view of the embodiment of an LED light according to the present disclosure with a large number of heat dissipation fins.

FIG. 1 is a perspective view showing an embodiment of an LED light according to the present disclosure, FIG. 2 is an exploded perspective view showing the embodiment of an LED light according to the present disclosure, FIG. 3 is a side view of the embodiment of an LED light according to the present disclosure with a small number of heat dissipation fins, and FIG. 4 is a side view of the embodiment of an LED light according to the present disclosure with a large number of heat dissipation fins.

The LED light may include a base plate 2, an LED module 4, a heat dissipation module 6, and a hanger 8. The LED module 4 may be disposed on the base plate 2. The heat dissipation module 6 may be mounted on the base plate 2. The heat generated from the LED module 4 may transfer to the base plate 2 and the heat transferred to the base plate 2 may be transferred to the heat dissipation module 6 to be dissipated by the heat dissipation module 6. The weight of the LED module 4 and the weight of the heat dissipation module 6 may be supported by the base plate 2, and the load of the base plate 2 may be supported by the hanger 8.

The LED module 4 may be disposed beneath the base plate 2. The LED module 4 may be disposed to be able to radiate light downward. The LED module 4 may be fastened to the base plate 2 by fasteners. The fasteners stated herein may include bolts and nuts that are thread-fastened to the bolts. The fastener may also be screws that are thread-fastened to threads formed in a base material. The LED module 4 may be supported on the base plate 2, and the load of the LED module 4 may be applied to the base plate 2. The LED module 4 may include a metallic top plate, a PCB on the bottom of the top plate, and a plurality of LEDs arranged in a dot formation on the PCB. The top plate of the LED module 4 can function as a heat dissipation plate that absorbs and transmits the heat of the PCB to the heat dissipation module 6. The top plate of the LED module 4 may be formed in a plate shape. The top plate of the LED module 4 may be fastened to the base plate 2 by fasteners.

The LED light may further include a light transmission window 41 and a gasket 42 surrounding the light transmission window 41. The LED light may further include a front cover 44 detachably attached to the base plate 2. The light transmission window 41 may be a lens that transmits the light radiated from LEDs. The light transmission window 41 may be fixed around the gasket 42. The gasket 42 may be formed in a ring shape. The gasket 42 may be sized to surround the edge of the LED module 4 and can prevent water or foreign substances from flowing into the LED module 4. The gasket 42 may be seated and supported on the front cover 44.

The front cover 44 may have a bottom plate with a light hole at the center, on which the gasket 42 is seated. The front cover 44 may have an edge bending from the bottom plate and surrounding the gasket 42. The front cover 44 may be attachable/detachable to/from the base plate 2. For example, a hook 46 may be formed at one of the front cover 44 and the base plate 2 and a hook hole 47 where the hook 46 is elastically attached/detached may be formed at the other one.

The LED module 6 may be disposed on the base plate 2. The load of the heat dissipation module 6 may be applied to the base plate 2. The heat dissipation module 6 can absorb the heat of the base plate 2 and dissipate it to the atmosphere. The heat dissipation module 6 may include heat pipes 62 receiving the heat of the base plate 2 and heat dissipation fins 64 receiving heat from the heat pipes 62 and dissipating it to the atmosphere. In the heat dissipation module 62, the heat pipes 62 may be disposed at the base plate 2 and the heat dissipation fins 64 may be disposed at the heat pipes 62.

The heat pipes 62 may have a heat absorbing portion 66 that is in contact with the base plate 2 and a heat dissipating portion 68 that is in contact with the heat dissipation fins 64. The heat absorbing portion 66 and the heat dissipating portion 68 may be integrally formed. The heat dissipating portion 68 may be bent relative to the heat absorbing portion 66. For example, the heat dissipating portion 68 may be perpendicular to the heat absorbing portion 66. The heat absorbing portion 66 may be horizontally disposed on the base plate 2 and the heat dissipating portion 68 may be vertically disposed over the base plate 2.

The heat pipe 62 may have a space in which a working fluid flows. The working fluid may rise to the heat dissipating portion 68 by vaporizing in the heat absorbing portion 66 and may descend to the heat absorbing portion 66 by cooling in the heat dissipating portion 68. The heat pipe 62 may be rounded at the joint of the heat absorbing portion 66 and the heat dissipating portion 68.

The heat dissipation module 6 may include a plurality of heat pipes 62. The heat pipes 62 may be spaced from each other. The heat pipes 62 may be spaced horizontally over the base plate 2. The heat pipes 62 may be fixed with the heat dissipation fins 64. The heat dissipation fins 64 may be fixed with the heat dissipating portions 68 of the heat pipes 62.

The higher a weight of the heat dissipating portion 68, a greater number of the heat pipes 62 in the heat dissipation module 6. The height of the heat dissipating portion 68 may be proportionate to the number of the heat dissipation fins 64 on the heat pipes 62. The larger the number of the heat dissipation fins 64, the larger the height of the heat dissipating portions 68 may be, and the lower the number of the heat dissipation fins 64 on the heat dissipating portions 68, the smaller the height may be.

In the heat absorbing portion 66 and the heat dissipating portion 68 of the heat pipe 62, the heat absorbing portion 66 may be fastened to the base plate 2. The heat absorbing portion 66 can be installed on the base plate 2 by an adhesive material such as an adhesive. The heat absorbing portion 66 can be installed on the base plate 2 by a heat pipe holder 70. The heat pipe holder 70 may cover at least a portion of the heat absorbing portion 66, and the heat pipe 62 may be fixed with at least a portion of the heat absorbing portion 66 between the base plate 2 and the heat pipe holder 70. The heat absorbing portion 66 may be inserted and fixed between the heat pipe holder 70 and the base plate 2. The heat absorbing portion 66 may extend out from between the heat pipe holder 70 and the base plate 2. The heat pipe holder 70 may surround a portion of the heat absorbing portion 66 of the heat pipe holder 70. The heat pipe holder 70 may be fastened to the base plate by fasteners. The heat pipe holder 70 may be fastened to a fastening portion integrally protruding from the base plate 2.

The heat dissipation fin 64 may be disposed on the heat pipe 62 and thermally coupled thereto. The heat dissipation fin 64 may be disposed on the heat dissipating portion 68 of the heat pipe 62. The heat dissipation fins 64 may be disposed and supported on a plurality of heat pipes 62. The heat dissipation module 6 may include a plurality of heat dissipation fins 64. The heat dissipation fins 64 may be arranged on the heat dissipating portions 68. The heat dissipation fins 64 may be arranged as an assembly of plurality of heat dissipation fins 64 stacked over each other. Each of the heat dissipation fins 64 may have a disk or ring shape, or another appropriate shape based on the desired application and shape of the LED light.

The heat dissipation fins 64 may be spaced from each other on the heat dissipating portions 68. The heat dissipation fins 64 may be spaced vertically from each other on the heat dissipating portions 68. In the heat dissipation module 6, the heat dissipation fins 64 may be spaced vertically from each other on the heat pipes 62 horizontally spaced from each other. The heat dissipation fins 64 may be fitted on the heat dissipating portions 68. A heat pipe-fixing hole 65 may be formed at the heat dissipation fins 64. A plurality of heat pipe-fixing holes 65 may be formed at each of the heat dissipation fins 64 and the number may correspond to the number of the heat pipes 62 on the base plate 2. In the heat pipe 62, the heat dissipating portions 68 may be combined with the heat dissipation fins 63 by being sequentially fitted in the heat pipe-fixing holes 65 at the heat dissipation fins 64.

The hanger 8 may be a member for installing an LED light which is provided for mounting an LED light on the ceiling or a wall in a room. The hanger 8 may be fastened to at least one of the base plate 2, the heat dissipation module 6, and an upper bracket 90, which is described below, and can support the load of the LED light. The hanger 8 may protect at least a portion of a converter 110 to be described below. The hanger 8 may also be referred to herein as a mounting assembly, bracket, or the like.

The hanger 8 may include a ring 82 and a converter protector 84. The converter protector 84 may have a top plate 86A, a first side plate 86B bending from the top plate 86A to a side of the converter 110, and a second side plate 86C bending from the top plate 86A to another side of the converter 110. The ring 82 may be disposed on the top plate 86A.

A wire holder 87 that is rounded to surround a portion of a wire 112 connecting the converter 110 and the LED module 4 may be formed at the converter protector 84. The wire holder 87 may be formed at least one of the first side plate 86B and the second side plate 86C. A portion of the wire 112 may be fixed and arranged between the wire holder 87 and the converter 110.

The hanger 8 may include a bottom plate fixed to the upper bracket 90 by fasteners 88, which is described below. The bottom plate may include a first bottom plate 89A horizontally bending from the first side plate 86B and fixed to the upper bracket 90 by the fasteners 88 and a second bottom plate 89B horizontally bending from the second side plate 86C and fixed to the upper bracket 90 by the fasteners 88.

The LED light 1 may include the upper bracket 90. The LED light may include lower brackets 100 fastened to the base plate 2 and the upper bracket 90. The lower bracket 100 may be fastened to the upper bracket 90 where the height being adjustable. Through-holes 94 through which fasteners 92 pass may be formed at any one of the upper bracket 90 and the lower bracket 100. Oblong holes 96, through which fasteners 92 may pass and which are vertically longer than the through-holes 94, may be formed on the other one of the upper or lower bracket 90, 100.

In the LED light, at least one of the upper bracket 90 and the lower bracket 100 may be disposed to surround a portion of the edge of the heat dissipation module 6. In the LED light, at least one of the upper bracket 90 and the lower bracket 100 may function as a handle that allows a person to hold the LED light during installation or servicing. In the LED light, at least one of the upper bracket 90 and the lower bracket 100 may function as a heat dissipation module housing that protects of the heat dissipation module 6.

The upper bracket 90 may have a top plate 101 and side plates 102 which is bent down from the top plate 101. The upper bracket 90 may be fastened to the hanger 8. The top plate 101 of the upper bracket 90 may be fastened to the hanger 8. At least one heat dissipation hole 105 may be formed through the top plate 101. A wire through-hole 106 through which the wire 112 passes may be formed at the upper bracket 90. The wire through-hole 106 may be formed at the top plate 101 of the upper bracket 90. The upper bracket 90 may have a plurality of side plates 102.

A number of lower brackets 100 may correspond to a number of side plates 102 of the upper bracket 90. The lower bracket 100 may have a bottom plate 103 and a side plate 104 that is bent up from the bottom plate 103. The bottom plate 103 of the lower bracket 100 may be fastened to the base plate 2 by fasteners 108. The side plate 104 of the lower bracket 100 may be fastened to the upper bracket 90 where the height being adjustable.

The positions of the fastening members 92 passing through the oblong holes 96 may depend on the number of the heat dissipation fins 64 disposed the LED light, as illustrated in FIGS. 3 and 4. The distance between the upper end 96' of the oblong hole 96 and the fastening member 92 may be proportionate to the number of the heat dissipation fins 64. The larger the number of the heat dissipation fins 64, the closer to the lower end 96" of the oblong hole 96 the fastening members 92 may be disposed, and the smaller the number of the heat dissipation fins 64, the closer to the upper end 96' of the oblong hole 96 the fastening members 92 may be disposed. One of the oblong holes 96 and the through-hole 94 may be formed at the side plate 102 of the upper bracket 90 and the other one may be formed at the side plate 104 of the lower bracket 100.

The LED light may further include the converter 110. The converter 110 may be a rectifier that converts AC into DC. The converter 110 may be connected with the LED module 4 by the wire 112. The converter 110 can apply DC power to the LED module 4 through the wire 112. The converter 110 may be mounted on the upper bracket 90. The hanger 110 may have a bottom plate fastened to the upper bracket 90 by fasteners 113. The bottom plate may include a first bottom plate 114A horizontally protruding from a side of the lower portion of the converter 110 and fixed to the upper bracket 90 by the fasteners 113, and a second bottom plate 114B horizontally protruding from the other side of the lower portion and fixed to the upper bracket 90 by the fasteners 113. For the converter 110, converters having different capacities may be selectively provided, depending on the heat dissipation capacity of the heat dissipation module 6.

The LED light may further include studs 120 that connect the base plate 2 and the upper bracket 90. The stud 120 may be formed in a hollow cylindrical shape. The studs 120 can function as supports that support the base plate 2 to the upper bracket 90. The studs 120 can function as may supports by connecting the base plate 2 and the upper bracket 90, such that the load of the heat dissipation module 6 and the load of the LED module 4 may be applied to the base plate 2, and the studs 120 can support the base plate 2 to the upper bracket 90 together with the heat dissipation module 6 and the LED module 4.

The studs 120 may be arranged vertically between the upper bracket 90 and the base plate 2. The lower portion of the studs 120 may be fixed to the base plate 2 and the upper portion may be fixed to the upper bracket 90. The lower portion of the studs 120 may be fastened to the base plate 2 by fasteners. The fasteners may be connected to the lower portion of the studs 120 through through-holes formed at the base plate 2. The upper portion of the studs 120 may be fastened to the upper bracket 90 by fasteners 124. The fasteners 124 may be connected to the upper portion of the studs 120 through through-holes formed at the top plate 101 of the upper bracket 90. The studs 120 may be disposed between the base plate 2 and the upper bracket 90 and they may distribute the load on the base plate 2. The heights H2 and H4 of the studs 120 may be proportionate to the number of the heat dissipation fins 64 on the heat pipes 62. The larger the number of the heat dissipation fins 64 on the heat pipes 62, the larger the height of the studs 120 may be, and the smaller the number of the heat dissipation fins 64 on the heat pipes 62, the lower the height may be.

Hereinafter, the operation of the LED light of the present disclosure is described. In the LED light, as an example, the LED module 4 and the heat dissipation module 6 are fastened to the base plate 2, the base plate 2 is fastened to the upper bracket 90 by the lower brackets 100, and the upper bracket 90 may be fastened to the hanger 8, in which the load of all of the LED module 4, the heat dissipation module 6, and the base plate 2 may be applied to the hanger 8 through the lower brackets 100 and the upper bracket 90.

In the LED light, as another example, the LED module 4 and the heat dissipation module 6 are fastened to the base plate 2, the base plate 2 is fastened to the upper bracket 90 by the studs 120, and the upper bracket 90 may be fastened to the hanger 8, in which the load of the LED module 4, the heat dissipation module 6, and the base plate 2 may be applied to the hanger 8 through the studs 120 and the upper bracket 90.

In the LED light, as another example, the LED module 4 and the heat dissipation module 6 are fastened to the base plate 2, the base plate 2 is fastened to the upper bracket 90 by the studs 120 and the lower brackets 100, and the upper bracket 90 may be fastened to the hanger 8, in which the load of all of the LED module 4, the heat dissipation module 6, and the base plate 2 may be applied to the upper bracket 90 and the hanger 8 through the studs 120 and the lower brackets 100.

The heat dissipation capacity of the LED light may depend on the number of the heat dissipation fins 64. The larger the number of the heat dissipation fins 64, the larger the heat dissipation capacity of the LED light, and the smaller the number of the heat dissipation fins 64, the smaller the heat dissipation capacity. In the LED light, referring to FIGS. 3 and 4, the distance between the base plate 2 and the upper bracket 90 may be small when the number of the heat dissipation fins 64 is small, and the distance between the base plate 2 and the upper bracket 90 may be large, when the number of the heat dissipation fins 64 is large. Four heat dissipation fins 64 are disposed on the LED light shown in FIG. 3, while six heat dissipation fins 64 are disposed in the LED light shown in FIG. 4. The heat dissipation capacity of the LED light of FIG. 4 with more heat dissipation fins may be greater than the heat dissipation capacity of the LED light of FIG. 3 with less heat dissipation fins.

The heat dissipation capacity of the LED light may be changed by replacing the heat pipes 62, the converter 110, and the studs 120. When the converter 110 is a variable resistance, control type, the heat dissipation capacity of the LED light may be changed by replacing the heat pipes 62 and the studs 120.

In the LED light, the base plate 2, the heat dissipation fins 64, and the upper bracket 90 may be used in common, except the heat pipes 62, the converter 110, and the studs 120. In the LED light, as shown in FIG. 3, when the number of the heat dissipation fins 4 is small, the heat pipes 62 having the small height H1 and the studs 120 having the small height H2 may be provided. In contrast, in the LED light, as shown in FIG. 4, when the number of the heat dissipation fins 6 is large, the heat pipes 62' having the height H3 (H3>H1) larger than the height of the heat pipes 62 of the LED light shown in FIG. 3 may be provided and the studs 120' having the height H4 (H4>H2) larger than the height of the studs 120 of the LED light shown in FIG. 3 may be provided.

In the LED light, as shown in FIG. 3, when the number of the heat dissipation fins 4 is small, the heat pipes 62 having the small height H1 may be provided and the lower brackets 100 may be fastened at higher positions on the upper bracket 90. In contrast, in the LED light, as shown in FIG. 4, when the number of the heat dissipation fins 6 is large, the heat pipes 62' having the height H3 (H3>H1) larger than the height of the heat pipes 62 of the LED light shown in FIG. 3 may be provided and the lower brackets 100 may be fastened at lower positions on the upper bracket 90.

In the LED light, as shown in FIG. 3, when the number of the heat dissipation fins 4 is small, the heat pipes 62 having the small height H1 and the studs 120 having the small height H2 may be provided, and the lower brackets 100 may be fastened at higher positions on the upper bracket 90. In contrast, in the LED light, as shown in FIG. 4, when the number of the heat dissipation fins 6 is large, the heat pipes 62' having the height H3 (H3>H1) larger than the height of the heat pipes 62 of the LED light shown in FIG. 3 may be provided, the studs 120' having the height H4 (H4>H2) larger than the height of the studs 120 of the LED light shown in FIG. 3 may be provided, and the lower brackets 100 may be fastened at lower positions on the upper bracket 90.

Figure 5:
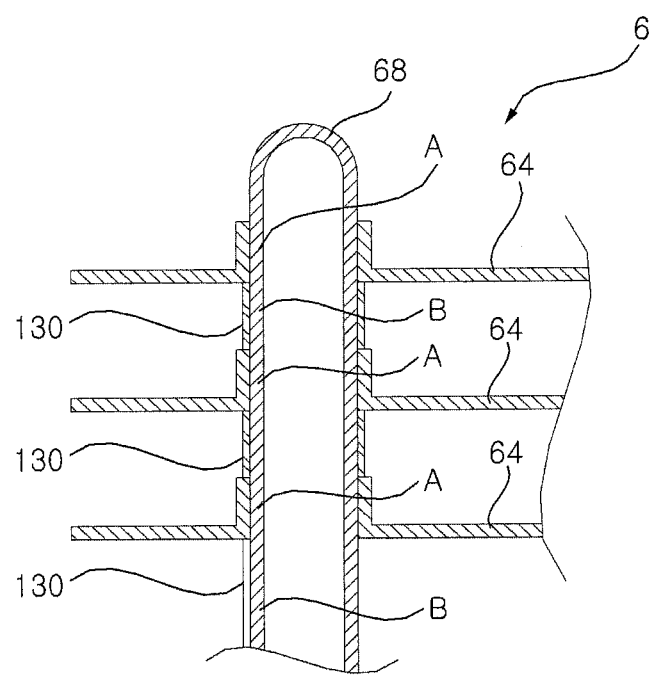
FIG. 5 is an enlarged cross-sectional view showing a heat pipe and heat dissipation fins of another embodiment of an LED light according to the present disclosure.

FIG. 5 is an enlarged cross-sectional view showing a heat pipe and heat dissipation fins of another embodiment of an LED light according to the present disclosure. In the LED light, spacers 130 may be provided that space multiple heat dissipation fins 64 from each other at the heat dissipating portions 68. The embodiment is the same or similar in configuration and operation, except the spacers 130, to the previous embodiment, so the same reference numerals are used and the detailed description is not provided.

The spacers 130 may be positioned between the heat dissipation fins 64 on the outer side of the heat dissipating portion 68. The spacers 130 may have a ring shape. The spacers 130 may be acryl-coated portions. The heat dissipating portion 68 may have a heat dissipation fin contact area A that is in contact with the heat dissipation fin 64 and a spacer-forming area B where the spacer 130 is formed without being in contact with the heat dissipation fin 64.

Figure 6:
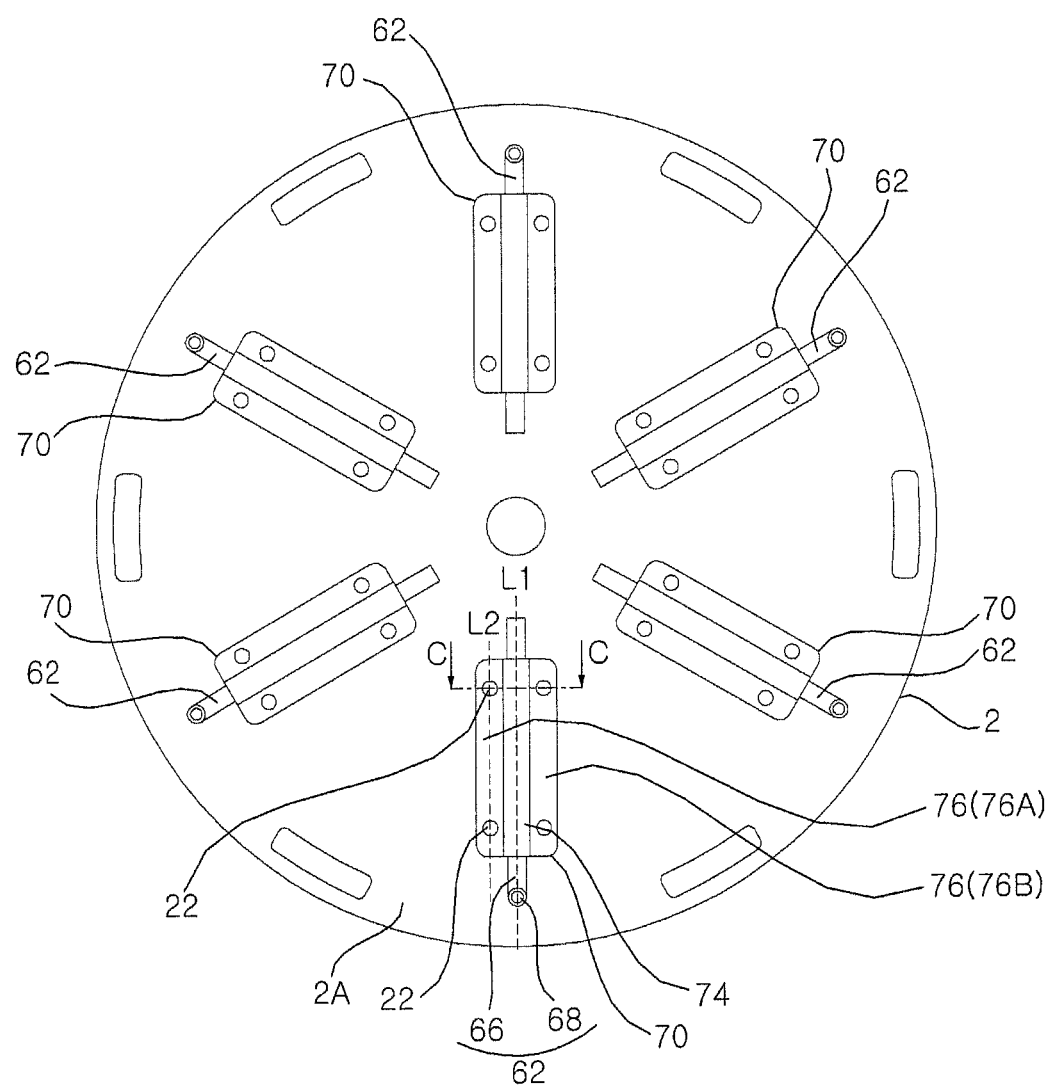
FIG. 6 is an enlarged plan view showing a heat pipe holder of another embodiment of an LED light according to the present disclosure.
Figure 7:
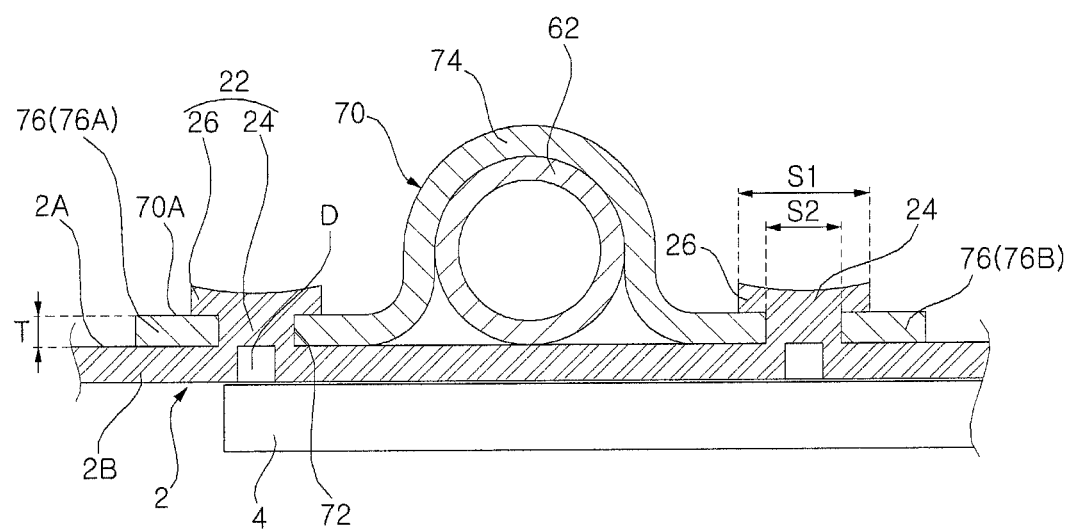
FIG. 7 is a cross-sectional view taken along line C-C shown in FIG. 6.

FIG. 6 is an enlarged plan view showing a heat pipe holder of an LED light according to the present disclosure, FIG. 7 is a cross-sectional view taken along line C-C shown in FIG. 6, and FIGS. 8A to 8C are views illustrating a process of combining a base plate and a heat pipe holder according to one embodiment.

In the LED light, heat pipe holders 70 may be fastened to fastening portions 22 which may be integrally formed on the base plate 2. The heat pipe holder 70 may be fastened to the base plate only by the fastening portions 22 without fasteners such as bolts or nuts. The heat pipe holders 70 may be directly fastened to the base plate 2 by the fastening portions 22. When the heat pipe holder 70 is fastened to the base plate 2, the fastening portions 22 may hold the heat pipe holder 70 to the base plate 2 while being positioned through the heat pipe holder 70. The fastening portion 22 may be provided around outer edges of the heat pipe holder to press the heat pipe holder 70 to the base plate 2 around the heat pipe holder 70, without passing through the heat pipe holder 70.

In the following description, it is assumed that the fastening portion 22 passes through the heat pipe holder 70 and a through-hole 72 for passing the fastening portion 22 is formed at the heat pipe holder 70. The fastening portion 22 can fix the heat pipe holder 70 to the base plate 70, passing through the through-hole 72 of the heat pipe holder 70.

The heat pipe holder 70 may have a holding portion 74 covering a portion of the heat pipe 62 together with the base plate 2 and a fixed portion 76 integrally formed with the holding portion 74 and fixed to the fastening portion 22. The heat pipe holder 70 may have one holding portion 74 and one fixed portion 76 or may have one holding portion 74 and a plurality of fixed portions 76. In the heat pipe holder 70, a first fixed portion 76A may be formed at a side of the holding portion 74 and a second fixed portion 76B may be formed at the other side of the holding portion 74. In the following description, it is assumed that the fixed portion 76 is described as having a common configuration for the first fixed portion 76A and the second fixed portion 76B, and when they are separately described, the first fixed portion 76A and the second fixed portion 76B are discriminated from each other to have different configurations.

The holding portion 74 can cover a portion of the outer circumference of the heat pipe 62. The holding portion 74 can cover a portion of the heat absorbing portion 66 of the heat pipe 62. The holding portion 74 may be rounded with a semicircular cross-section or an elliptical cross-section. The fixed portion 76 may be formed in a plate shape and one side of the fixed portion 76 may be in surface contact with the base plate 2. The surface, which faces the base plate 2, of the fixed portion 76 may be in surface contact with the base plate 2. The fixed portion 76 may be a flange. The surface, which does not face the base plate 2, of the fixed portion 76 may not be in contact with the top of the base plate 2. The through-hole 72 may be formed to correspond to the fixed portion 76, not the holding portion 74. A plurality of through-holes 72 may be formed at the fixed portion 76 and a plurality of fastening portions 22 may be fastened to the fixed portions 76.

Through-hole passing portions 24 that pass the through-holes 72 may protrude on the base plate 2. Pressing portions 26 that press the heat pipe holders 70 to the base plate 2 may protrude from the through-hole passing portions 24. The through-hole passing portion 24 and the pressing portion 26 may form the fastening portion 22 that is integrally formed on the base plate 2.

The through-hole passing portion 24 may protrude opposite to the LED module 4. The through-hole passing portion 24 may protrude opposite to the LED module 4, on the top of the base plate 2. The through-hole passing portion 24 may be formed in a cylindrical shape, a polygonal-cylindrical shape or another appropriate shape based on the application.

The pressing portion 26 may protrude in contact with the top surface 70A of the heat pipe holder 70. The pressing portion 26 may protrude in parallel with the top surface 2A of the base plate 2, over the through-hole passing portion 24. The top surface 2A of the base plate 2 may be the portion, except the through-hole passing portion 24 and the pressing portion 26, in the top of the base plate 2. The pressing portion 26 may be a contact portion that the top surface 2A of the base plate 2 is in contact with. The pressing portion 26 may function as a locking step where the base plate 2 is vertically locked. The pressing portion 26 may have a step T from the top surface 2A of the base plate 2. The pressing portion 26 may cover a portion of the top surface 70A of the heat pipe holder 70. The pressing portion 26 may be larger in size than the through-hole. That is, the size S1 (or width) of the pressing portion 26 may be larger than the size S2 (or width) of the through-hole 72 after the pressing portion 26 is pressed down.

The pressing portion 26 of the fastening portion 22 may be formed by forming a protrusion first on the base plate by pressing a portion of the base plate 2 and then deforming the protrusion under pressure, in which a space D with the top and the side closed and the bottom open may be formed under the through-hole passing portion 24 in the base plate 2. The base plate 2 may be divided into the fastening portion 22 an a plate portion 2B by the portion where the through-hole passing portion 24 protrudes from the base plate 2. The plate portion 2B may be the portion except the through-hole passing portion 24 and the pressing portion 26 in the base plate 2 and may be a non-protruding portion. The space D may be formed at the plate portion 2B and may be formed with the bottom open in the plate portion 2B. The pressing portion 26 may restrict separation of the heat pipe holder 70 while being spaced from the top 2A of the plate portion 2B.

The fastening portion 22 may be formed by riveting, and in the following description, the fastening portion 22 is referred to as a riveted portion 22 merely for convenience and the same reference numerals are used. The riveted portions 22 fixing the heat pipe holders 70 to the base plate 2 may be formed on the base plate 2. The riveted portion 22 may protrude opposite to the LED module 4. The riveted portion 22 may protrude with a step T from the top of the base plate 2. The riveted portion 22 may protrude with a step T from the top 2A of the plate portion 2B. The riveted portion 22 may cover a portion of the top surface 70A of the heat pipe holder 70. A plurality of riveted portions 22 may be spaced in direction L2 parallel with the length direction L1 of the heat pipe holders 70. A space D with the top and the side closed and the bottom open may be formed under the riveted portion 22 in the base plate 2.

Figure 8A:
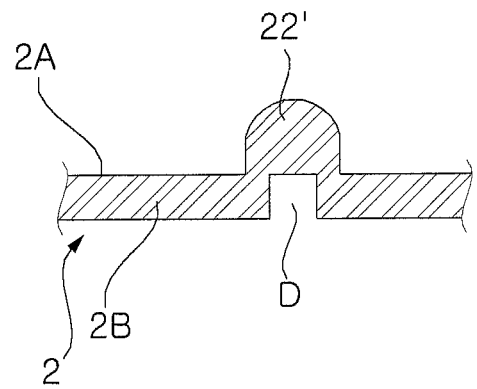
FIGS. 8A to 8C are views illustrating a process of combining a base plate and a heat pipe holder according to another embodiment of an LED light according to the present disclosure.
Figure 8B:
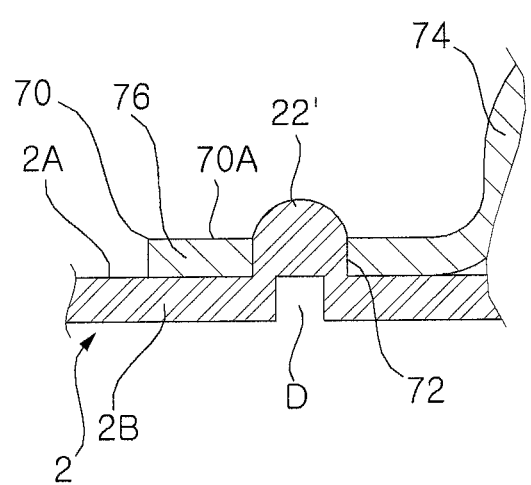
Figure 8C:
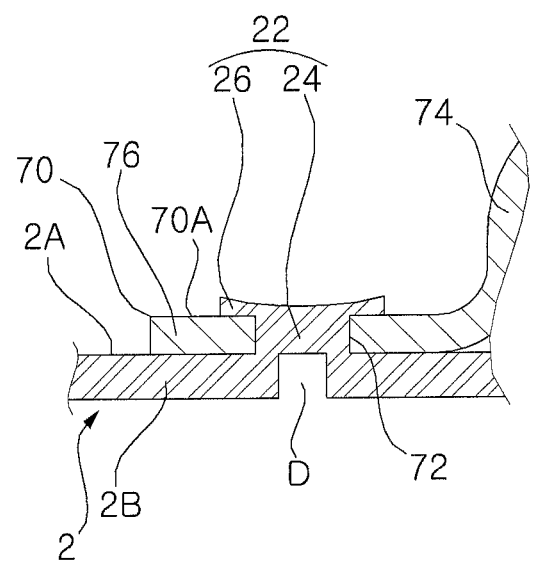

FIGS. 8A to 8C are views illustrating a process of combining a base plate and a heat pipe holder according to another embodiment of an LED light according to the present disclosure. FIG. 8A is a cross-sectional view when a protrusion 22' is formed on the base plate 2. FIG. 8B is a cross-sectional view when the heat pipe holder 70 is seated on the base plate, in which the protrusion 22' passes through the through-hole 72 of the heat pipe holder 70. FIG. 8C is a cross-sectional view when the protrusion 22' is deformed by riveting and the pressing portion 26 presses the heat pipe holder 70. The protrusion 22' shown in FIGS. 8A and 8B may be deformed into the pressing portion with the top deformed wide.

On the other hand, a method of manufacturing an LED light, as shown in FIG. 8A, may include a pressing step that forming the protrusion 22' by pressing a portion of the base plate 2 with a press. In the pressing step, the space D pressed for forming the protrusion 22' may be formed in the base plate 2. The method of manufacturing an LED light may include a heat pipe holder-seating step that arranges the protrusion 22' through the through-hole 72 of the heat pipe holder 70 while seating the heat pipe holder 70 onto the base plate 2. The method of manufacturing an LED light may include a riveting step that rivets the protrusion 22' by pressing it. In the riveting step, the protrusion 22' may be deformed into the pressing portion 26 covering a portion of the top surface 70A of the heat pipe holder 70 while the top expands, and the heat pipe holder 70 is restricted in downward movement, vertical movement, and horizontal movement by the plate portion 2B, the pressing portion 26, and the through-hole passing portion 24, respectively.

In the LED light, when the base plate 2 and the heat pipe holder 70 are combined, a gap is not formed through which water or foreign substances may flow inside, between the fastening portion 22 and the plate portion 2B. Here, water or foreign substances on the top surface 2A of the base plate 2 are prevented from flowing into the LED module 4 through the base plate 2, such that the waterproof ability of the LED light can be improved.

As can be appreciated in the foregoing disclosure of an LED light as broadly described and embodied herein, an object of the present disclosure is to provide an LED light that can control the heat dissipation capacity of a heat dissipation module. Another object of the present disclosure is to provide an LED light with high reliability.

In one embodiment, an LED light according to the present disclosure may include: a base plate; an LED module disposed beneath the base plate; a plurality of heat pipes having a heat absorbing portion being contact with the base plate and a heat dissipating portion bending from the heat absorbing portion; a plurality of heat dissipation fins spaced from each other on the heat dissipating portions; an upper bracket fastened to a hanger; and studs connecting the base plate and the upper bracket.

The studs may be fastened to the upper bracket by fasteners. The heights of the heat dissipating portion and the stud may be proportionate to the number of the heat dissipation fins. The LED light may further include lower brackets fastened to the base plate and fastened to the upper bracket with the height adjustable. The LED light may further include a converter disposed on the upper bracket and connected with the LED module by a wire. The upper bracket may have a wire through-hole through which the wire passes. Moreover, a spacer that spaces the heat dissipation fins may be formed at the heat dissipating portion.

In one embodiment, an LED light according to the present disclosure may include: a base plate; an LED module disposed beneath the base plate; a plurality of heat pipes having a heat absorbing portion being contact with the base plate and a heat dissipating portion bending from the heat absorbing portion; a plurality of heat dissipation fins spaced from each other on the heat dissipating portions; an upper bracket fastened to a hanger; and lower brackets fastened to the base plate and fastened to the upper bracket with the height adjustable.

Through-holes through which fasteners pass may be formed at any one of the upper brackets and the lower brackets, and oblong holes through which the fasteners pass and which are vertically longer than the through-holes may be formed at the other one. The position of the fasteners passing through the oblong holes may depend on the number of the heat dissipation fins. The distance between the upper end of the oblong hole and the fastener may be proportionate to the number of the heat dissipation fins.

The upper bracket may have a top plate and side plates bending down from the top plate. The lower bracket may have a bottom plate and a side plate bending up from the bottom plate. One of the oblong holes and the through-holes may be formed at the side plates of the upper bracket and the other one may be formed at the side plates of the lower brackets. Moreover, at least one heat dissipation hole may be formed at the top plate. In this embodiment, the upper bracket may have a plurality of side plates and the number of the lower brackets may be the same as the number of the side plates of the upper bracket.

In one embodiment, an LED light according to the present disclosure may include: a base plate; an LED module disposed beneath the base plate; a plurality of heat dissipation fins; and heat pipes having a heat absorbing portion being contact with the base plate and a heat dissipating portion being in contact with the heat dissipation fins, in which a spacer that spaces the heat dissipation fins is formed at the heat dissipating portion.

The spacer may be disposed between the heat dissipation fins, on the outer side of the heat dissipating portion. The spacer may be a ring. The spacer may be an acryl-coated portion. Moreover, the heat dissipating portion may have a heat dissipation fin contact area being in contact with the heat dissipation fin and a spacer-forming area where the spacer is formed without being in contact with the heat dissipation fin.

In one embodiment, an LED light according to the present disclosure may include: a base plate; an LED module disposed beneath the base plate; heat dissipation fins; heat pipes having a heat absorbing portion being contact with the base plate and a heat dissipating portion being in contact with the heat dissipation fins; and heat pipe holders at least partially covering the heat absorbing portions, in which riveted portions fixing the heat pipe holders to the base plate are integrally formed at the base plate.

The riveted portion may protrude opposite to the LED module. The riveted portion may protrude with a step from the top of the base plate. The riveted portion may cover a portion of the top of the heat pipe holder. The riveted portions may be spaced in the direction parallel with the length direction of the heat pipe holders. Moreover, the base plate may have a space with the top and the side closed and the bottom open, under the riveted portions.

In one embodiment, an LED light according to the present disclosure may include: a base plate; an LED module disposed beneath the base plate; heat dissipation fins; heat pipes having a heat absorbing portion being contact with the base plate and a heat dissipating portion being in contact with the heat dissipation fins; and heat pipe holders at least partially covering the heat absorbing portions and having through-holes, in which through-hole passing portions passing through the through-holes protrude on the base plate and pressing portions pressing the heat pipe holders to the base plate are formed at the through-hole passing portions.

The through-hole passing portion may protrude opposite to the LED module. The pressing portion may protrude in contact with the top of the heat pipe holder. The pressing portion may protrude in parallel with the top of the base plate, above the through-hole passing portion. The riveted portion may have a step from the top of the base plate. The pressing portion may cover a portion of the top of the heat pipe holder. The pressing portion may be larger in size than the through-hole. Moreover, the base plate may have a space with the top and the side closed and the bottom open, under the through-hole passing portion.

In one embodiment, a method of manufacturing an LED light according to the present disclosure may include: forming protrusions by pressing a portion of a base plate with a press; arranging the protrusions through through-holes of heat pipe holders while seating the heat pipe holders onto the base plate; and riveting the protrusions by pressing them.

The LED light as broadly described and embodied herein has the advantage in that it is possible to change the heat dissipation capacity by changing the number of the heat dissipation fins. That is, it is possible to change the heat dissipation capacity in a simple way by changing the number of the heat dissipation fins and replacing the heat pipes and the studs. Moreover, the disclosed LED light has the advantage in that it is possible to manufacture various models with different capacities while using the upper bracket, the base plate, and the hanger in common.

One advantage of the LED light of the present disclosure is that it is easy to control the height of the LED light. Moreover, the disclosed LED light has the advantage in that it is possible to prevent the heat dissipation fins from sagging and keep high heat dissipation performance.

One advantage of the LED light of the present disclosure is that it is possible to prevent water or foreign substances on the top of the base plate from flowing into the LED module through the portion where the heat pipe holders are fastened, and to reduce water flowing into the LED module as less as possible.

One advantage of the LED light of the present disclosure is that it is possible to fasten the heat pipe holders to the base plate in a simple process. It is also possible to minimize vibration by fixing the heat pipes under pressure. Moreover, the LED light of the present disclosure has the advantage in that specific fasteners for fastening the heat pipe holders to the base plate are not required and it is possible to minimize the number of parts.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An LED light comprising:
   a base plate;
   an LED module disposed under the base plate;
   a plurality of heat pipes provided over the base plate and having first portions radially arranged on the base plate and thermally coupled to the base plate and second portions that extend from outer edges of the radially arranged first portions;
   a plurality of heat dissipation fins provided over the base plate, the plurality of heat dissipation fins being spaced apart from each other and thermally coupled to the second portions of the heat pipes to dissipate heat from the LED module;
   an upper bracket provided over the plurality of heat dissipation fins and fastened to a hanger;
   a converter mounted over the upper bracket;
   a plurality of studs that connect the base plate to the upper bracket; and a plurality of lower brackets coupled to the base plate and the upper bracket, a height between the plurality of lower brackets and the upper bracket being adjustable, wherein the upper bracket and the plurality of lower brackets are disposed to surround the plurality of heat dissipation fins on at least four sides of the plurality of heat dissipation fins and provided at a prescribed distance from lateral sides of the plurality of heat dissipation fins, wherein the upper bracket has a top plate and a plurality of side plates that bends downward from the top plate toward the plurality of lower brackets, each of the plurality of lower brackets has a bottom plate and a side plate that bends upward from the bottom plate toward the upper bracket, the plurality of heat dissipation fins are disposed between the top plate of the upper bracket and the bottom plate of the plurality of lower brackets, the plurality of heat dissipation fins are disposed between the plurality of side plates of the upper bracket, and the bottom plate of the plurality of lower brackets is fastened to an upper surface of the base plate, and wherein the converter is configured to convert AC input into DC input and mounted on the top plate, and a wire is provided to connect between the LED module and the converter, each heat dissipation fin of the plurality of heat dissipation fins has a heat dissipation fin hole, the top plate has a wire through-hole that overlaps the heat dissipation fin hole, the base plate includes a hole that is surrounded by the radially arranged first portions of the plurality of heat pipes, the wire is connected to the LED module through the heat dissipation fin hole, the wire through-hole and the hole of the base plate, and the converter is disposed on the top plate to overlap the heat dissipation fin hole, the wire through-hole and the hole of the base plate.

2. The LED light of claim 1, wherein the studs are fastened to the upper bracket by fasteners.

3. The LED light of claim 2, wherein a height of the second portions of the plurality of heat pipes extending away from the base plate and the studs are proportionate to a number of heat dissipation fins of the plurality of heat dissipation fins.

4. The LED light of claim 3, wherein a spacer is provided on the second portions between adjacent heat dissipation fins to space heat dissipation fins of the plurality of heat dissipation fins from each other.

5. The LED light of claim 4, further including heat pipe holders that at least partially cover the first portions of the plurality of heat pipes and riveted portions integrally formed on the base plate to couple the heat pipe holders to the base plate.

6. The LED light of claim 5, wherein the riveted portions protrude in a direction opposite the LED module.

7. The LED light of claim 6, wherein first holes are provided on the upper bracket or the plurality of lower brackets, and second holes are provided on the other of the upper bracket and the plurality of lower brackets, wherein a fastener is provided through the first holes and the second holes to fasten the upper bracket to the plurality of lower brackets, the second holes having a vertically oblong shape such that a height of the upper and the plurality of lower brackets is adjustable, the first holes and the second holes are provided on the side plates of the upper bracket and the side plates of the plurality of lower brackets.

8. The LED light of claim 7, wherein a position of the fastener provided through the oblong second hole depends on a number of heat dissipation fins of the plurality of heat dissipation fins.

9. The LED light of claim 7, wherein a distance between an upper end of the oblong second hole and the fastener is proportionate to a number of heat dissipation fins of the plurality of heat dissipation fins.

10. The LED light of claim 7, wherein at least one heat dissipation hole is formed through the top plate the upper bracket, and the top plate of the upper bracket is be fastened to the hanger.

11. The LED light of claim 10, wherein at least one opening is provided on the top plate of the upper bracket and provided over the plurality of heat dissipation fins to allow heat flow through the upper bracket.

12. The LED light of claim 10, wherein a number of heat dissipation fins of the plurality of lower brackets corresponding to a number of the side plates of the upper bracket.

13. The LED light of claim 10, wherein the spacer is disposed between adjacent heat dissipation fins of the plurality of heat dissipation fins on an outer side surface of the second portions of the plurality of heat pipes.

14. The LED light of claim 5, wherein the riveted portions protrude with a step from the top of the base plate.

15. The LED light of claim 5, wherein the riveted portions cover a portion of an upper surface of the heat pipe holder.

16. The LED light of claim 5, wherein the riveted portions are spaced in a direction parallel with a length direction of the heat pipe holders.

17. The LED light of claim 5, wherein the base plate includes a recess formed on a bottom surface of the base plate opposite the riveted portions.

18. The LED light of claim 10, wherein a portion of the upper bracket and the plurality of lower brackets that surround the lateral sides of the plurality of heat dissipation fins are positioned a prescribed distance away from lateral ends of the plurality of heat dissipating fins.

* * * * *